US012707886B2

(12) United States Patent
Woo et al.

(10) Patent No.: US 12,707,886 B2
(45) Date of Patent: Aug. 11, 2026

(54) PEROVSKITE LIGHT EMITTING DEVICE

(71) Applicants: LG DISPLAY CO., LTD., Seoul (KR); KOREA UNIVERSITY RESEARCH AND BUSINESS FOUNDATION, Seoul (KR); UNIST(ULSAN NATIONAL INSTITUTE OF SCIENCE AND TECHNOLOGY), Ulju-gun Ulsan (KR)

(72) Inventors: Han Young Woo, Paju-si (KR); Kiseok Chang, Paju-si (KR); Myoung Hoon Song, Paju-si (KR); Jeong Min Moon, Paju-si (KR); Su Seok Choi, Paju-si (KR); Thanh Luan Nguyen, Paju-si (KR); Seungjin Lee, Paju-si (KR); Chung Hyeon Jang, Paju-si (KR)

(73) Assignees: LG Display Co., Ltd., Seoul (KR); Korea University Research Business Foundation, Seoul (KR); UNIST (ULSAN NATIONAL INSTITUTE OF SCIENCE AND TECHNOLOGY, Ulsan (KR)

( * ) Notice: Subject to any disclaimer, the term of this patent is extended or adjusted under 35 U.S.C. 154(b) by 1033 days.

(21) Appl. No.: 17/298,372

(22) PCT Filed: Nov. 20, 2019

(86) PCT No.: PCT/KR2019/015967

§ 371 (c)(1),
(2) Date: May 28, 2021

(87) PCT Pub. No.: WO2020/111650

PCT Pub. Date: Jun. 4, 2020

(65) Prior Publication Data

US 2022/0006017 A1 Jan. 6, 2022

(30) Foreign Application Priority Data

Nov. 30, 2018 (KR) ........................ 10-2018-0152009

(51) Int. Cl.
*H10K 85/60* (2023.01)
*H10K 50/11* (2023.01)
(Continued)

(52) U.S. Cl.
CPC ........... *H10K 85/615* (2023.02); *H10K 71/12* (2023.02); *H10K 71/811* (2023.02); *H10K 85/50* (2023.02);
(Continued)

(58) Field of Classification Search
CPC ............... H10K 50/15; H10K 2101/30; H10K 2101/40; H10K 85/615;
(Continued)

(56) References Cited

U.S. PATENT DOCUMENTS 9,214,255 B2 * 12/2015 Lee ........................ H01B 1/122
2008/0020208 A1 * 1/2008 Lee ...................... H10K 85/111
252/500
(Continued)

FOREIGN PATENT DOCUMENTS

AU 2015349902 A1 7/2017
CN 104681731 A 6/2015
(Continued)

OTHER PUBLICATIONS

English translation of KR 101476776 B1 obtained by Google Patents (Year: 2014).*
(Continued)

*Primary Examiner* — Jennifer A Boyd
*Assistant Examiner* — Braelyn R Watson
(74) *Attorney, Agent, or Firm* — Fish & Richardson P.C.

(57) ABSTRACT

A perovskite light emitting diode having degradation of the characteristics of the light emitting device, caused by
(Continued)

PEDOT:PSS can be improved by replacing PEDOT:PSS contained in a conventional hole transport layer with an anionic conjugated polymer having ammonium-based counter ions, and the light emission characteristics can be greatly improved by passivating defects of a perovskite light emitting layer with a hole transport layer containing a conjugated polymer and increasing crystal growth.

6 Claims, 15 Drawing Sheets

(51) Int. Cl.

| | |
|---|---|
| ***H10K 50/15*** | (2023.01) |
| ***H10K 71/00*** | (2023.01) |
| ***H10K 71/12*** | (2023.01) |
| ***H10K 85/50*** | (2023.01) |
| ***H10K 101/30*** | (2023.01) |
| ***H10K 101/40*** | (2023.01) |
| *H10K 50/84* | (2023.01) |
| *H10K 71/40* | (2023.01) |
| *H10K 102/00* | (2023.01) |

(52) U.S. Cl.
CPC .............. *H10K 50/11* (2023.02); *H10K 50/15* (2023.02); *H10K 50/84* (2023.02); *H10K 71/40* (2023.02); *H10K 2101/30* (2023.02); *H10K 2101/40* (2023.02); *H10K 2102/00* (2023.02); *H10K 2102/351* (2023.02)

(58) Field of Classification Search
CPC ........ H10K 85/10–154; H01L 51/5056; H01L 2251/552; H01L 51/0052; H01L 51/0039; H01L 51/0034; H01L 51/0035; H01L 51/0036; H01L 51/0037; H01L 51/0038; H01L 51/004; H01L 51/0041; H01L 51/0042; H01L 51/0043; H01L 51/0044
See application file for complete search history.

(56) References Cited

U.S. PATENT DOCUMENTS

| | | | | |
|---|---|---|---|---|
| 2011/0204295 | A1* | 8/2011 | Kuwabara | C09B 57/008 252/299.61 |
| 2013/0068305 | A1 | 3/2013 | Lee et al. | |
| 2017/0054099 | A1* | 2/2017 | Friend | H10K 50/17 |
| 2017/0125171 | A1 | 5/2017 | Lee et al. | |
| 2017/0352823 | A1 | 12/2017 | Kim et al. | |
| 2018/0323014 | A1* | 11/2018 | Wang | H10K 50/11 |
| 2019/0051834 | A1* | 2/2019 | Liu | H10K 85/633 |
| 2020/0044176 | A1* | 2/2020 | Xu | H10K 71/15 |

FOREIGN PATENT DOCUMENTS

| | | | | | |
|---|---|---|---|---|---|
| CN | 105384917 | A | | 3/2016 | |
| CN | 106233482 | A | | 12/2016 | |
| CN | 107464886 | A | | 12/2017 | |
| GB | 2535698 | A | * | 8/2016 | C07F 15/0033 |
| KR | 10-2010-0091024 | A | | 8/2010 | |
| KR | 10-1220442 | B1 | | 3/2012 | |
| KR | 101476776 | B1 | * | 12/2014 | |
| KR | 10-1684636 | B1 | | 2/2016 | |
| KR | 10-2018-0018910 | A | | 2/2018 | |
| KR | 10-2018-0062368 | A | | 6/2018 | |

OTHER PUBLICATIONS

Jin, Y.et cl., “Improved electron injection in polymer light-emitting diodes using anionic conjugated polyelectrolyte”, Appl. Phys. Lett., Sep. 23, 2008, vol. 93123304) 1-3 pp.

Chinese Office Actionl dated Jun. 20, 2024l Application No. 201980079130.X.

* cited by examiner

PEROVSKITE LIGHT EMITTING DEVICE

CROSS-REFERENCE TO RELATED APPLICATION

This application is a National Phase Entry of PCT International Application No. PCT/KR2019/015967 filed on Nov. 20, 2019, which claims priority to Korean Application No. 10-2018-0152009 filed on Nov. 30, 2018, which are hereby incorporated by reference in their entirety.

BACKGROUND

Field of the Disclosure

The present disclosure relates to a perovskite light-emitting device.

Description of the Background

Currently, a display industry is changing from inorganic light-emitting devices to organic light-emitting devices. Organic light-emitting devices are attracting attention as next-generation flexible electronic devices because of their flexible features, relatively simple structure and manufacturing process, and light weight. Further, inorganic quantum dot materials are attracting attention next to the organic light-emitting devices due to their high color purity.

However, even though the organic light-emitting device has high efficiency, a full width at half maximum (FWHM) of a light-emitting spectrum thereof is wide, so that the color purity is poor. An inorganic quantum dot whose light-emitting color is controlled by a size of the quantum dot has good color purity. However, it is very difficult to control the size of the quantum dot during a synthesis process.

Further, the organic light-emitting devices and the inorganic quantum dot materials are limited in production of low-priced products due to their high manufacturing costs. Therefore, interest in a perovskite light-emitting device which has high color purity, a simple manufacturing process, and a lower manufacturing cost is increasing.

In particular, metal halide perovskite materials have inexpensive. A synthesis method thereof is very simple. The metal halide perovskite material may be subjected to a solution process. Further, the metal halide perovskite material has photoluminescence and electric field electroluminescence characteristics, and may be applied to a light-emitting device.

However, although the metal halide perovskite may have such advantages in terms of the light-emitting device, the metal halide perovskite may have limitations in the application thereof to the light-emitting devices.

First, the light-emitting efficiency is deteriorated due to various kinds of defects existing at a perovskite interface or inside the interface.

For example, point defects and linear grain boundaries act as traps, thus causing electrons and holes into nonradiative recombination in a form of heat. Thus, in the light emitting device and a solar cell, the efficiency thereof may be deteriorated. In other words, since an energy level of these defects exists between energy levels of a conduction band and a valence band, electrons or holes are trapped at the energy level of the defect, thus limiting the transfer of the charge and thus leading to unwanted nonradiative recombination.

In order to reduce such defects, a passivation layer may be formed before forming a perovskite light-emitting layer. However, conventional materials used to form the passivation layer generally have no conductivity, which is disadvantageous in terms of the hole or charge transport.

Second, the perovskite light-emitting layer is usually disposed on top of the hole transport layer. PEDOT:PSS which is used as a material for the hole transport layer exhibits strong acidity, and thus adversely affects a lifespan, performance and stability of the light-emitting device. Further, a result of a study that has been reported shows that fluorescence quenching of excitons occurs severely at an interface between PEDOT:PSS and an active layer.

The above information disclosed in this Background section is only for enhancement of understanding of the background of the described technology and therefore it may contain information that does not form prior art that is already known in this country to a person of ordinary skill in the art.

SUMMARY

Accordingly, the present disclosure is directed to a perovskite light-emitting device that substantially obviates one or more of problems due to limitations and disadvantages of the prior art.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

The present disclosure provides a perovskite light-emitting device in which defects in a perovskite light-emitting layer when growing the perovskite light-emitting layer on a hole transport layer may be prevented without introducing a separate passivation layer between the hole transport layer and the perovskite light-emitting layer.

In addition, the present disclosure provides a perovskite light-emitting device in which PEDOT:PSS contained in a conventional hole transport layer is replaced with a conjugated polymer having a specific counter ion, thereby preventing degradation of light-emitting characteristics as caused by PEDOT:PSS.

The present disclosure is not limited to the above-mentioned purposes. Other features and advantages of the present disclosure, as not mentioned above, may be understood from the following descriptions and more clearly understood from the aspects of the present disclosure. Further, it will be readily appreciated that the features and advantages of the present disclosure may be realized by features and combinations thereof as disclosed in the claims.

A perovskite light-emitting device according to the present disclosure includes a first electrode; a hole transport layer disposed on the first electrode; a perovskite light-emitting layer disposed on the hole transport layer; an electron transport layer disposed on the perovskite light-emitting layer; and a second electrode disposed on the electron transport layer, wherein the hole transport layer contains a compound represented by a following Chemical Formula 1;

[Chemical Formula 1]

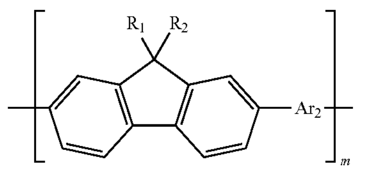

wherein m is an integer between 1 and 1,000,000:

wherein each of $R_1$ and $R_2$ is independently $-Ar_3-(O-C_nH_{2n}-X^-Y^+)_p$; n is an integer between 1 and 20, p is an integer between 1 and 3, wherein $Ar_3$ is phenylene, or wherein $X^-$ is $SO_3^-$, and $Y^+$ is $NR_3R_4R_5R_6^+$, wherein each of $R_3$ to $R_6$ is independently selected from an alkyl group having 1 to 20 carbon atoms, wherein $Ar_2$ is a substituted or unsubstituted arylene.

According to the present disclosure, PEDOT:PSS contained in the conventional hole transport layer is replaced with the conductive conjugated polymer having an ionic functional group, thereby preventing deterioration of the lifespan, the performance and the stability of the light-emitting device as caused by acidic PEDOT:PSS while maintaining the characteristics of the hole transport layer.

Further, the conjugated polymer contained in the hole transport layer has a specific counter ion, thereby imparting a passivation effect to an interface between the hole transport layer and the perovskite light-emitting layer. Thus, when growing the perovskite light-emitting layer on the hole transport layer, defects in the perovskite light-emitting layer may be suppressed. Accordingly, it is not necessary to form a separate passivation layer on the hole transport layer in order to prevent the defects in the perovskite light-emitting layer.

In addition to the above-described effects, specific effects of the present disclosure will be described together while describing specific details of the disclosure.

BRIEF DESCRIPTIONS OF DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIG. 1 schematically shows a cross-section of a perovskite light-emitting device according to an aspect of the present disclosure;

Figure 21:
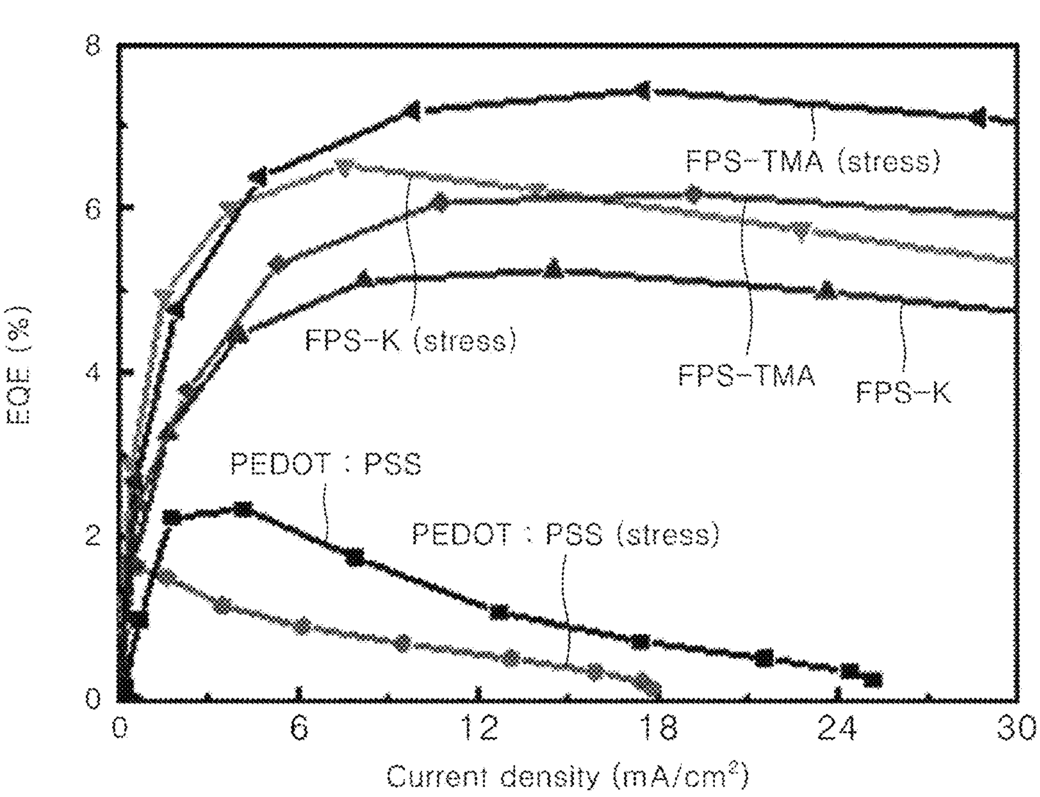
Figure 22:
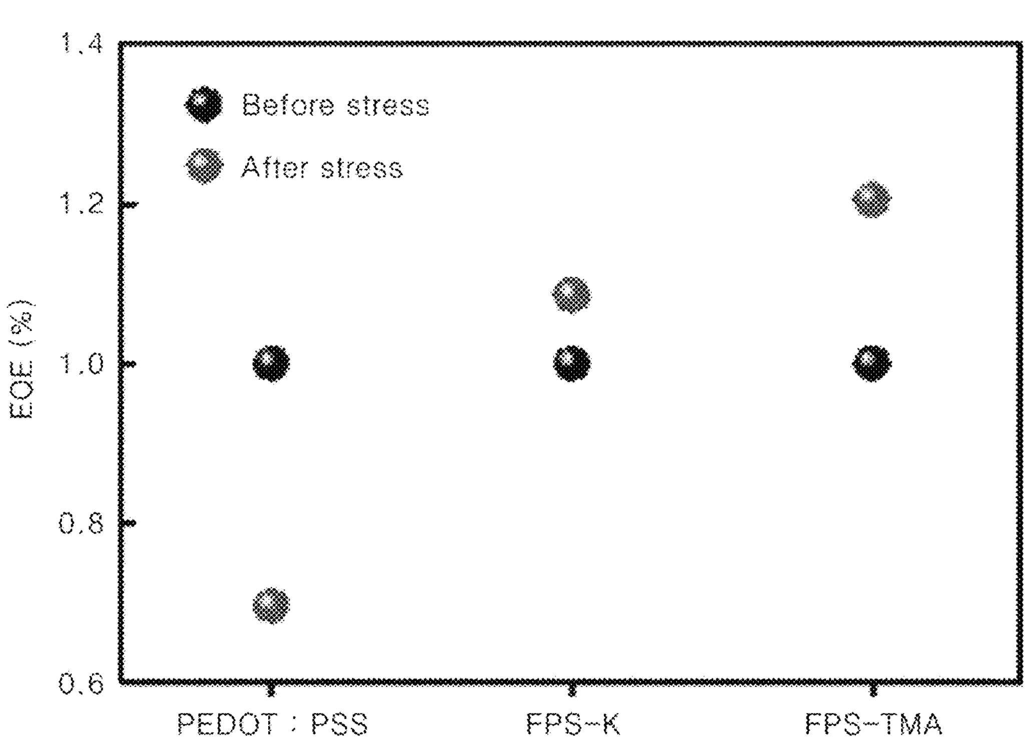

FIG. 21 shows results of measuring changes in external quantum efficiency based on electrical stress (current density) applied to perovskite light-emitting devices manufactured according to Example 1, Example 2, and Comparative Example 1, respectively; and FIG. 22 shows results of measuring changes in external quantum efficiency before and after application of electrical stress to perovskite light-emitting devices manufactured according to Example 1, Example 2, and Comparative Example 1, respectively.

DETAILED DESCRIPTIONS

The features and advantages as above-described will be described in detail below with reference to the accompanying drawings. Accordingly, a person with ordinary knowledge in the technical field to which the present disclosure belongs may easily implement a technical idea of the present disclosure. In describing the present disclosure, when it is determined that a detailed description of a known component related to the present disclosure may unnecessarily obscure a gist of the present disclosure, the detailed description thereof is omitted. Hereinafter, aspects of the present disclosure will be described in detail with reference to the accompanying drawings. The same reference numerals in the drawings are used to indicate the same or similar components.

In addition, it will also be understood that when a first element or layer is referred to as being present "on (or beneath)" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Hereinafter, perovskite light-emitting devices according to some aspects of the present disclosure will be described.

Figure 1:
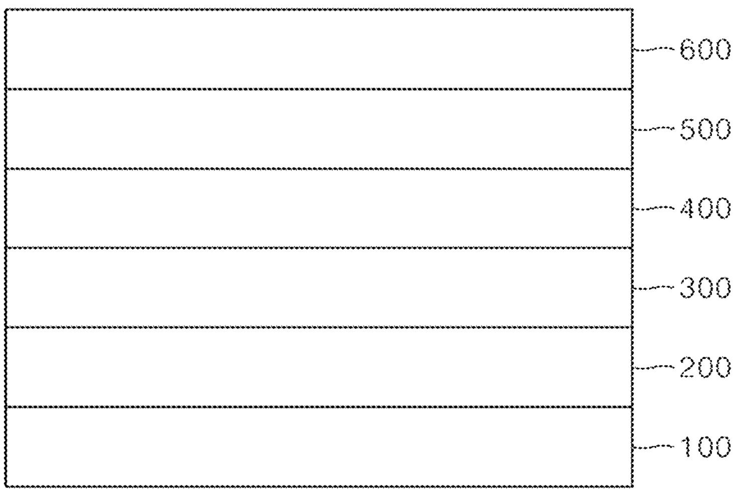

FIG. 1 schematically shows a cross-section of a perovskite light-emitting device according to an aspect of the present disclosure.

Referring to FIG. 1, the perovskite light-emitting device according to an aspect of the present disclosure includes a first electrode 200 disposed on a substrate 100, a hole transport layer 300 disposed on the first electrode 200, a perovskite light-emitting layer 400 disposed on the hole transport layer 300, an electron transport layer 500 disposed on the perovskite light-emitting layer 400, and a second electrode 600 disposed on the electron transport layer 500.

In the perovskite light-emitting device, when a voltage is applied across the first electrode 200 and the second electrode 600, holes injected from the first electrode 200 moves to the perovskite light-emitting layer 400 through the hole transport layer 300, and electrons injected from the second electrode 600 move to the perovskite light-emitting layer 400 through the electron transport layer 500. Carriers such as the holes and electrons recombine with each other in the perovskite light-emitting layer 400 to create excitons. Light is emitted as the exciton changes from an excited state to a ground state.

The substrate 100 may be a substrate used in a conventional semiconductor process. For example, the substrate 100 may include silicon, silicon oxide, metal foil (e.g., copper foil, aluminum foil, stainless steel foil, etc.), metal oxide, polymer substrate, and combinations of thereof.

The metal foil may be made of a material that has a high melting point and does not act as a catalyst capable of forming graphene. Examples of the metal oxide include aluminum oxide, molybdenum oxide, indium tin oxide, and the like. Examples of the polymer substrate include Kepton foil, polyethersulphone (PES), polyacrylate (PAR), polyetherimide (PEI), polyethylene napthalate (PEN), polyethyleneterephthalate (PET), polyphenylenesulfide (PPS), polyarylate, polyimide, polycarbonate (PC), cellulose triacetate (TAC), cellulose acetate propionate (CAP), etc. However, the disclosure is not limited thereto.

The first electrode 200 may be made of a conductive polymer or a conductive metal oxide such as Indium Tin Oxide (ITO) or Fluorine-doped Tin Oxide (FTO), but is not limited thereto. For example, the first electrode 200 may be made of graphene, carbon nanotubes, reduced graphene oxide, metal nanowires, or metal grids.

The first electrode 200 may be formed using a deposition process such as physical vapor deposition (PVD), chemical vapor deposition (CVD), sputtering, pulsed laser deposition (PLD), thermal evaporation, electron beam evaporation, atomic layer deposition (ALD) or molecular beam epitaxy (MBE).

In one example, the first electrode 200 may have a structure including a conductive layer (not shown) and a surface energy-tuning layer (not shown). Specifically, the surface energy-tuning layer may be disposed on the conductive layer.

The conductive layer may include a conductive polymer and a first fluorine-based material. The surface energy tuning layer may include a second fluorine-based material, but may not include the conductive polymer included in the conductive layer. In this connection, the first fluorine-based material and the second fluorine-based material may be the same as or different from each other.

For example, the conductive polymer may include polythiophene, polyaniline, polypyrrole, polystyrene, polyethylenedioxythiophene, polyacetylene, polyphenylene, polyphenylvinylene, polycarbazole, a copolymer containing two or more different repeating units thereof, derivatives thereof, or blends of two or more thereof.

In this connection, an absolute value of an ionization potential level of the surface energy tuning layer is greater than an absolute value of an ionization potential level (or HOMO energy: Highest Occupied Molecular Orbital level) of the perovskite light-emitting layer 400. Thus, hole transfer from the surface energy tuning layer to the perovskite light-emitting layer 400 may be made smoothly. Accordingly, since the exciton generation efficiency in the perovskite light-emitting layer 400 may be increased, characteristics such as efficiency, low driving voltage, and lifespan of the perovskite light-emitting device may be improved.

The hole transport layer 300 disposed on the first electrode 200 may include a material having a hole mobility greater than an electron mobility under the same electric field.

More specifically, the hole transport layer 300 may contain a compound represented by a following Chemical Formula 1:

[Chemical Formula 1]

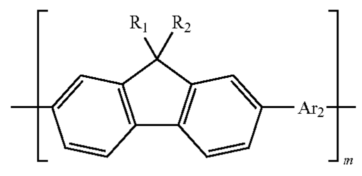

In this connection, m is an integer between 1 and 1,000,000:

where each of $R_1$ and $R_2$ is independently $-Ar_3-(O-C_nH_{2n}-X^-Y^+)_p$; n is an integer between 1 and 20, p is an integer between 1 and 3, $Ar_3$ is phenylene, $X^-$ is $SO_3^-$, $Y^+$ is $NR_3R_4R_5R_6^+$, each of $R_3$ to $R_6$ is independently selected from an alkyl group having 1 to 20 carbon atoms, $Ar_2$ is a substituted or unsubstituted arylene.

In this connection, the alkyl group having 1 to 20 carbon atoms means a saturated aliphatic group including straight-chain alkyl and branched alkyl having 1 to 20 carbon atoms. The straight-chain or branched alkyl may have 10 or smaller (e.g., $C_1$-$C_{10}$ straight chain, $C_3$-$C_{10}$ branched), alternatively, 4 or smaller, or 3 or smaller carbon atoms in a main chain thereof.

Specifically, the alkyl group may include a methyl group, ethyl group, n-propyl group, i-propyl group, n-butyl group, s-butyl group, i-butyl group, t-butyl group, pent-1-yl group, pent-2-yl group, pent-3-yl group, 3-methylbut-1-yl group, 3-methylbut-2-yl group, 2-methylbut-2-yl group, 2,2,2-trimethyleth-1-yl group, n-hexyl group, n-heptyl group and n-octyl group, but may not be necessarily limited thereto.

As used herein, aryl refers to an unsaturated aromatic ring including a single ring or multiple rings (alternatively, 1 to 4 rings) fused to or covalently linked to each other, unless otherwise defined. Non-limiting examples of aryl may include phenyl, biphenyl, o-terphenyl, m-terphenyl, p-terphenyl, 1-naphthyl, 2-naphthyl, 1-anthryl, 2-anthryl, 9-anthryl, 1-phenanthrenyl, 2-phenanthrenyl, 3-phenanthrenyl, 4-phenanthrenyl, 9-phenanthrenyl, 1-pyrenyl, 2-pyrenyl, and 4-pyrenyl.

$Ar_2$ may be a substituted or unsubstituted aryl. When $Ar_2$ is substituted arylene, hydrogen bonded to any carbon in the arylene may be substituted with a functional group selected from deuterium, substituted or unsubstituted $C_1$-$C_{10}$ alkyl, substituted or unsubstituted $C_2$-$C_{10}$ heteroalkyl containing at least one hetero atom, substituted or unsubstituted $C_2$-$C_{10}$ alkenyl, substituted or unsubstituted $C_2$-$C_{10}$ alkynyl, substituted or unsubstituted $C_2$-$C_{10}$ alkoxy, substituted or unsubstituted aryloxy, substituted or unsubstituted $C_1$-$C_{10}$ haloalkyl, halogen, cyano, hydroxy, substituted or unsubstituted amino, substituted or unsubstituted amide, carbamate, nitro, carboxyl, carboxylate, substituted or unsubstituted aryl, substituted or unsubstituted heteroaryl, substituted or unsubstituted aralkyl, and quaternary ammonium. However, a kind of the functional group substituting hydrogen in $Ar_2$ may be determined as long as the properties of the hole transport layer material represented by the Chemical Formula 1 intended herein are not damaged.

$Ar_3$ may independently be phenylene, pyrrolylene, furanylene, thiophenylene or selenophenylene having 1 to 3 alkoxy substituents, and may include a following chemical formula group.

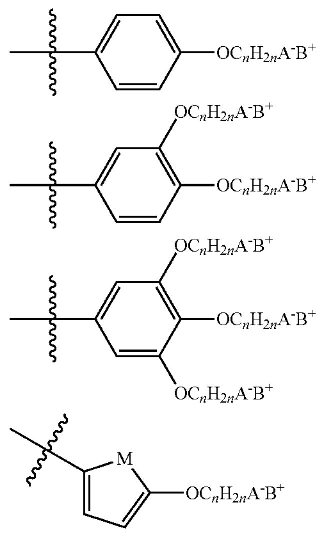

-continued

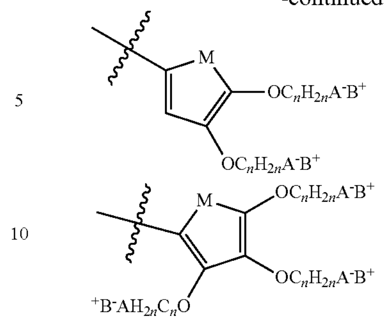

In this connection, M is oxygen, nitrogen, sulfur or selenium.

Herein, halogen means fluoro (—F), chloro (—Cl), bromo (—Br) or iodo (—I). Haloalkyl means an alkyl substituted with the above-described halogen. For example, halomethyl means methyl (—$CH_2X$, —$CHX_2$ or —$CX_3$) in which at least one of hydrogens of methyl has been replaced with halogen.

Further, herein, alkoxy refers to both —O-(alkyl) group and —O-(unsubstituted cycloalkyl) group. In this connection, alkyl group refers to straight-chain or branched alkyl group having 1 to 10 carbon atoms, and unsubstituted cycloalkyl group refers to cycloalkyl group having 3 to 10 carbon atoms.

Specifically, alkoxy includes methoxy, ethoxy, propoxy, isopropoxy, n-butoxy, tert-butoxy, sec-butoxy, n-pentoxy, n-hexoxy, 1,2-dimethylbutoxy, cyclopropyloxy, cyclobutyloxy, cyclopentyloxy, cyclohexyloxy, and the like, but is not limited thereto.

When the functional group substituting hydrogen in $Ar_2$ is alkenyl or alkynyl, $sp^2$-hybrid carbon of alkenyl or sp-hybrid carbon of alkynyl may be directly bound thereto or may be indirectly bound thereto via $sp^3$-hybrid carbon of alkyl coupled to $sp^2$-hybrid carbon of alkenyl or sp-hybrid carbon of alkynyl.

Herein, heteroaryl refers to a functional group in which at least one carbon atom in aryl as defined above is substituted with a non-carbon atom such as nitrogen, oxygen or sulfur.

Non-limiting examples of heteroaryl may include furyl, tetrahydrofuryl, pyrrolyl, pyrrolidinyl, thienyl, tetrahydrothienyl, oxazolyl, isoxazolyl, triazolyl, thiazolyl, isothiazolyl, pyrazolyl, pyrazolidinyl, oxadiazolyl, thiadiazolyl, imidazolyl, imidazolinyl, pyridyl, pyridaziyl, triazinyl, piperidinyl, morpholinyl, thiomorpholinyl, pyrazinyl, piperazinyl, pyrimidinyl, naphthyridinyl, benzofuranyl, benzothienyl, indolyl, indolinyl, indolizinyl, indazolyl, quinolizinyl, quinolinyl, isoquinolinyl, cinolinyl, phthalazinyl, quinazolinyl, quinoxalinyl, pteridinyl, quinuclidinyl, carbazoyl, acridinyl, phenazinyl, phenothizinyl, phenoxazinyl, purinyl, benzimidazolyl, benzothiazolyl, etc. and analogs to which they are bound.

Herein, aralkyl refers to a functional group as aryl-substituted alkyl and is a generic term of —$(CH_2)_n$Ar. Examples of aralkyl include benzyl (—$CH_2C_6H_5$) or phenethyl (—$CH_2CH_2C_6H_5$).

Herein, cycloalkyl or heterocycloalkyl containing a hetero atom may be understood as a cyclic structure of alkyl or heteroalkyl, respectively, unless otherwise defined.

Non-limiting examples of cycloalkyl include cyclopentyl, cyclohexyl, 1-cyclohexenyl, 3-cyclohexenyl and cycloheptyl, and the like.

Non-limiting examples of cycloalkyl containing the hetero atom include 1-(1,2,5,6-tetrahydropyridyl), 1-piperidinyl, 2-piperidinyl, 3-piperidinyl, 4-morpholinyl, 3-morpholinyl, tetrahydrofuran-2-yl, tetrahydrofuran-3-yl, tetrahydrothien-2-yl, tetrahydrothien-3-yl, 1-piperazinyl and 2-piperazinyl, and the like.

Further, cycloalkyl or cycloalkyl containing a hetero atom may have a form in which cycloalkyl, cycloalkyl containing a hetero atom, aryl or hetero aryl are fused or covalently linked thereto.

The compounds represented by the Chemical Formula 1 may include following compounds, and are merely examples of representative compounds and are not necessarily limited thereto.

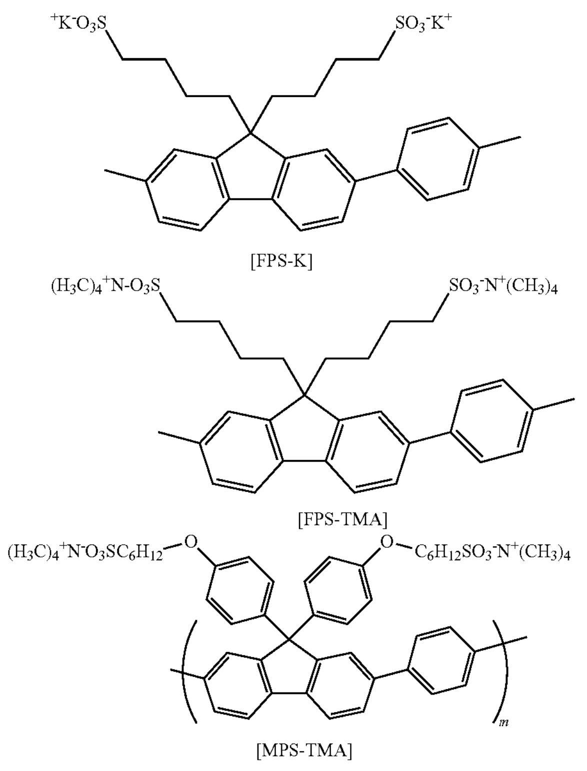

[FPS-K]

[FPS-TMA]

[MPS-TMA]

The compound represented by the Chemical Formula 1 including FPS-K, FPS-TMA and MPS-TMA has electrical conductivity. Thus, a layer containing the compound represented by the Chemical Formula 1 may serve as a hole transport layer.

Further, the compound represented by the Chemical Formula 1 has a neutral pH, unlike PEDOT:PSS contained in the conventional hole transport layer, thereby preventing degradation of the performance, the stability, and the lifespan of the light-emitting device caused by acidic PEDOT:PSS.

Conventional passivation materials used to improve crystallinity of perovskite grown on the hole transport layer 300 are generally not conductive and thus have limitations in transporting the holes. However, the compound represented by the Chemical Formula 1 has an ionic functional group (for example, $K^+$, $N^+(CH_3)_4$), and thus ionic properties thereof may be controlled in an easy manner. When the compound contains the ions contained in the perovskite light-emitting layer 400, a passivation effect may be imparted to the interface between the hole transport layer 300 and the perovskite light-emitting layer 400. Accordingly, when growing the perovskite light-emitting layer 400 on the hole transport layer 300, the defect in the perovskite light-emitting layer 400 may be prevented.

In particular, MPS-TMA may contain a benzene ring in not only a main chain but also a branched chain, thereby improving the hydrophobicity of the compound. In this case, a contact angle of water on a surface of the hole transport layer 300 including MPS-TMA may be 10° or greater, or 15° or greater which is greater than 13.8° which is a contact angle of water on a surface of PEDOT:PSS. In this way, the hole transport layer 300 including MPS-TMA improves the hydrophobicity of a top surface of the hole transport layer 300 on which the perovskite light-emitting layer 400 is formed. Thus, when coating a precursor for forming the perovskite light-emitting layer 400 on the hole transport layer 300, damage to the hole transport layer 300 may be reduced.

Figure 2:
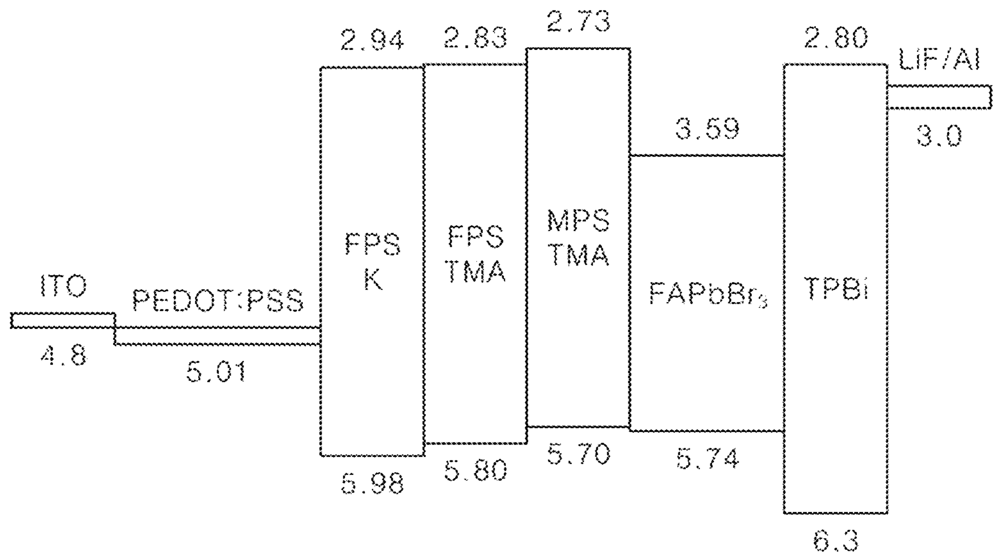
FIG. 2 shows an energy diagram of a perovskite light-emitting device to which PEDOT:PSS and a compound (FPS-K, FPS-TMA, MPS-TMA) represented by the Chemical Formula 1 are applied.
Figure 3:
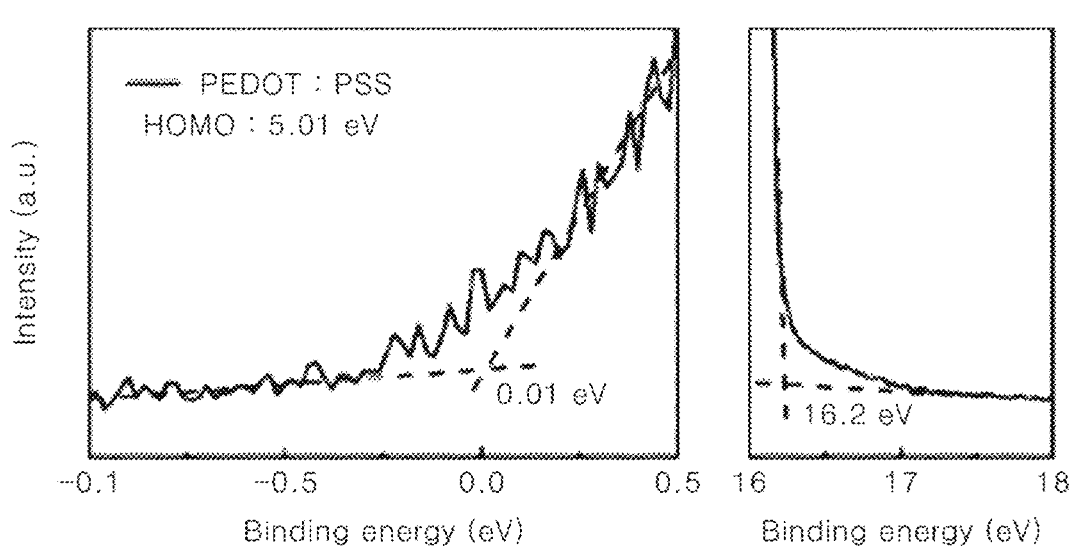
FIG. 3 shows an UPS measurement result of a HOMO level for a hole transport layer of a perovskite light-emitting device manufactured according to Comparative Example 1.
Figure 4:
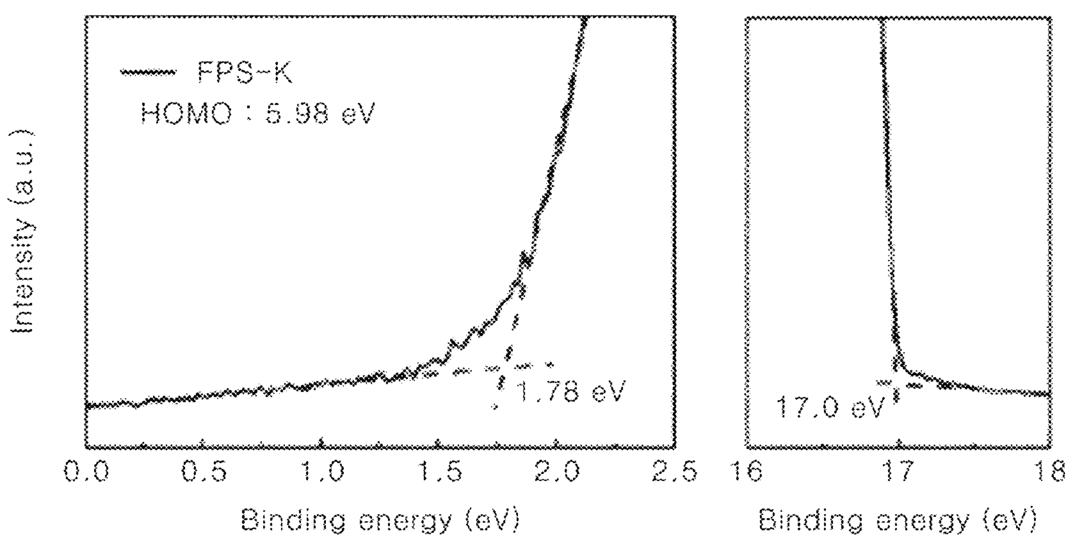
FIG. 4 to FIG. 6 show UPS measurement results of HOMO levels for hole transport layers of perovskite light-emitting devices manufactured according to Examples 1 to 3, respectively.
Figure 5:
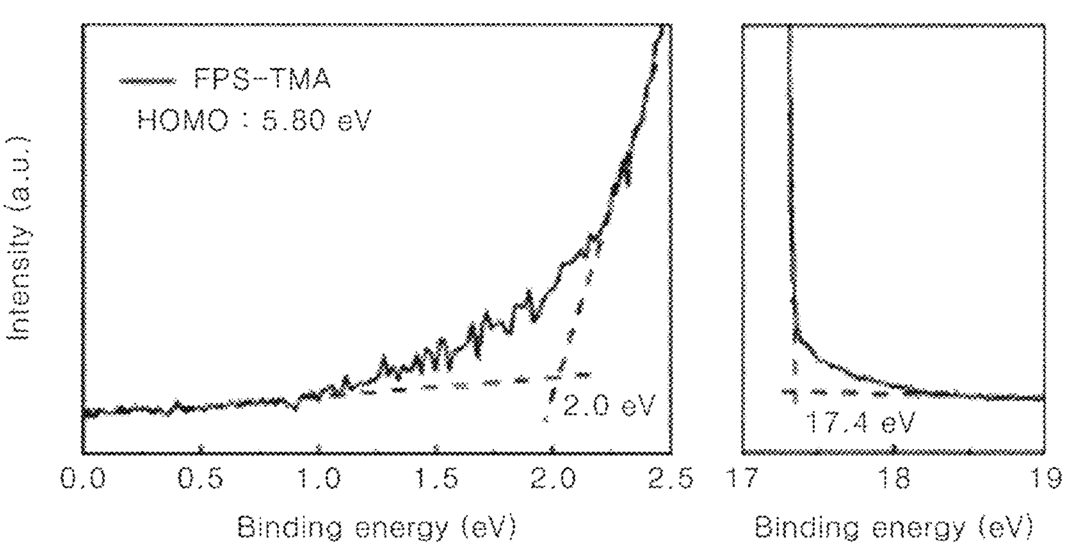
Figure 6:
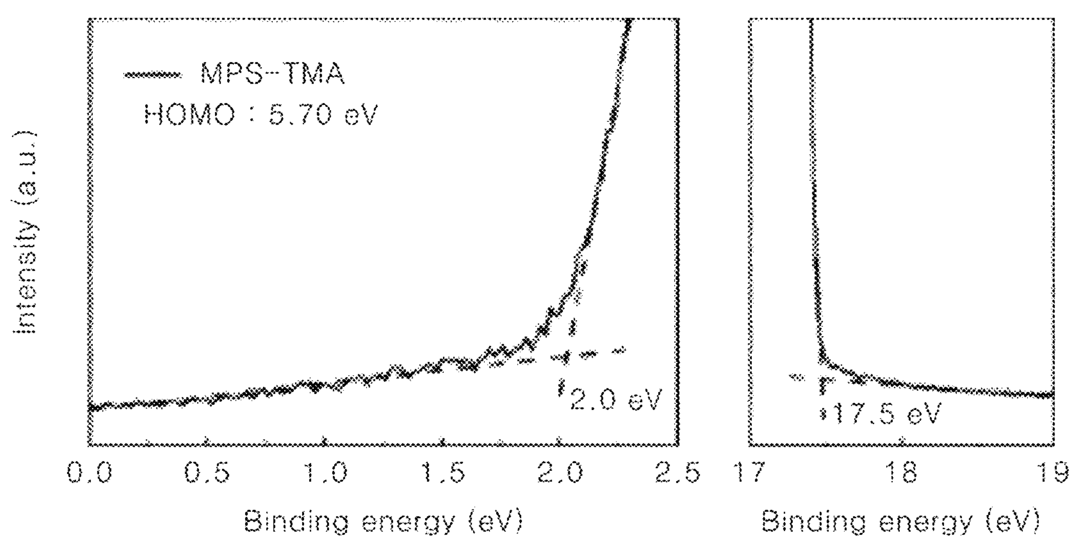
Figure 7:
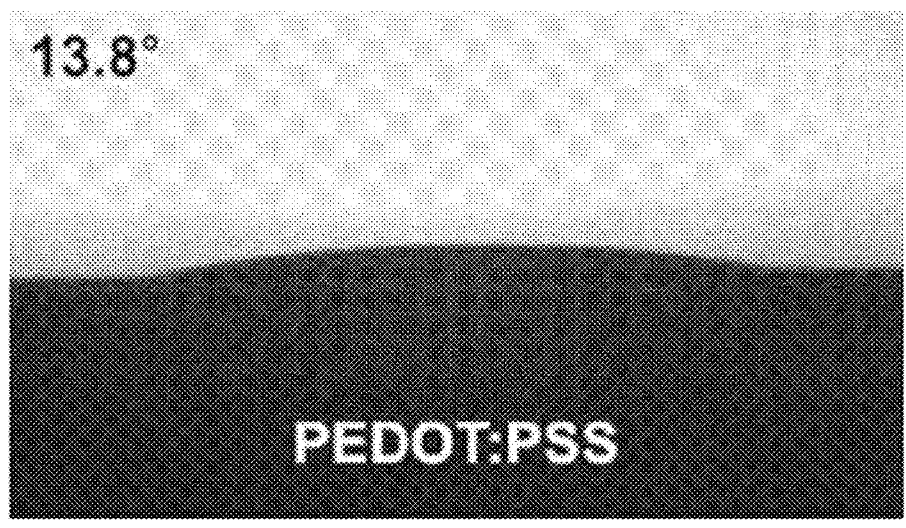
FIG. 7 shows a measurement result of a contact angle of water on a surface of a hole transport layer of the perovskite light-emitting device manufactured according to Comparative Example 1.
Figure 8:
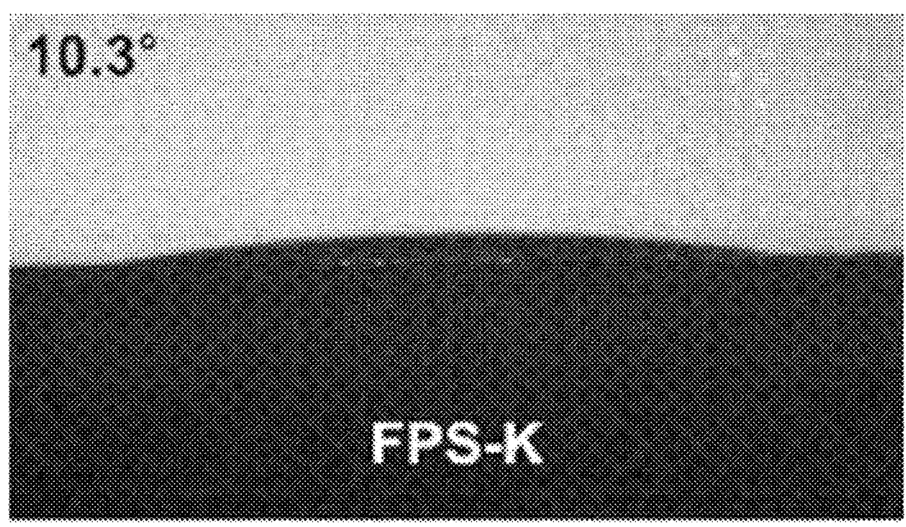
FIG. 8 to FIG. 10 show measurement results of contact angles of water on surfaces of the hole transport layers of the perovskite light-emitting devices manufactured according to Examples 1 to 3, respectively.
Figure 9:
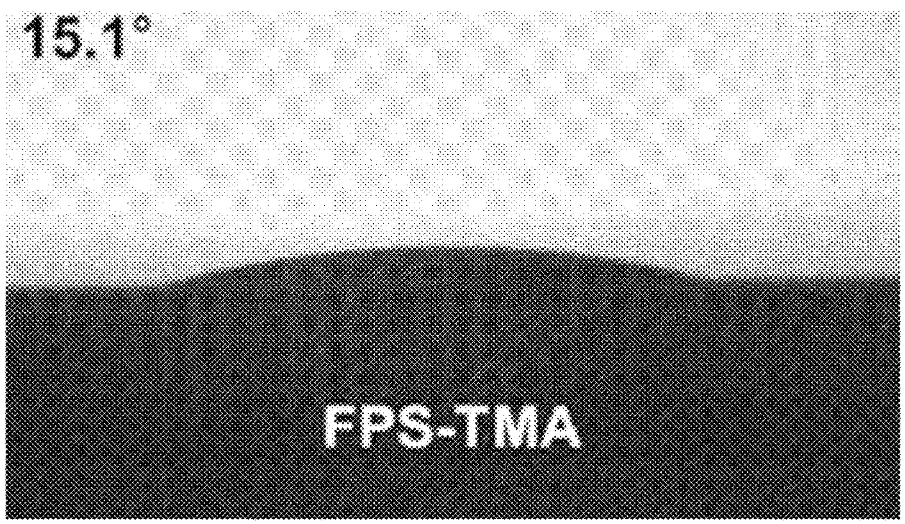
Figure 10:
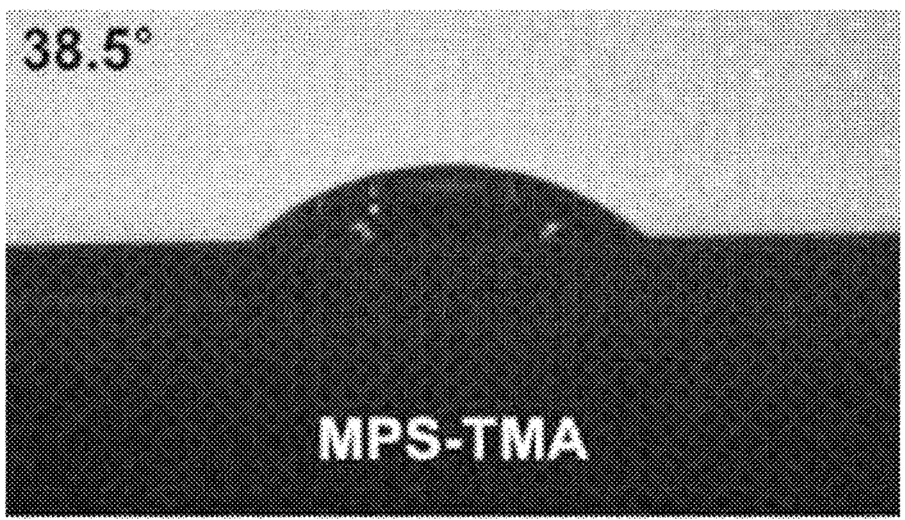

FIG. 2 shows energy diagrams of perovskite light-emitting devices to which PEDOT:PSS and the compound (FPS-K, FPS-TMA, MPS-TMA) represented by the Chemical Formula 1 are applied, respectively.

Referring to FIG. 2, a HOMO level of the hole transport layer 300 containing the compound represented by the Chemical Formula 1 may be 5.0 to 6.0 eV. A difference between the HOMO levels of the hole transport layer 300 containing the compound represented by the Chemical Formula 1 and the perovskite light-emitting layer 400 may be 0.26 eV or lower. Further, a difference between the LUMO levels of the hole transport layer 300 including the compound represented by the Chemical Formula 1 and the perovskite light-emitting layer 400 may be 0.3 eV or higher.

The HOMO level of the hole transport layer containing PEDOT:PSS used as a conventional hole transport material is about 5.01 eV. The difference between the HOMO levels of the hole transport layer containing PEDOT:PSS and the perovskite light-emitting layer 400 is about 0.70 eV or greater, may act as a large hole injection barrier. On the other hand, the compound represented by the Chemical Formula 1 have a deep HOMO level, unlike PEDOT:PSS, and thus may contribute to absence of the hole injection barrier.

Further, referring to FIG. 2, the hole transport layer 300 containing the compound represented by the Chemical Formula 1 has a low LUMO level of 2.70 to 3.0 eV, so that a gap between a conduction band thereof and a conduction band of the perovskite light-emitting layer 400 is large. Thus, electrons may be effectively blocked in the hole transport layer 300, thereby improving the recombination efficiency of holes and electrons in the perovskite light-emitting layer 400.

Additionally, the hole transport layer 300 may be subjected to post-treatment using application of electrical stress thereto.

In this connection, the electrical stress application may refer to a post-treatment in which an electric field is generated between the first electrode 200 and the second electrode 600 to allow ions contained in the compound represented by the Chemical Formula 1 to be effectively passivated on the surface of the hole transport layer 300 on which the perovskite light-emitting layer 400 is formed.

Further, the post-treatment herein may further include an aging treatment in which the perovskite light-emitting device that has been encapsulated after the application of electrical stress thereto is maintained at room temperature for 24 hours or greater.

By this aging treatment, defects at the perovskite crystal interface may be more effectively passivated by flow of ions at the interface between the hole transport layer 300 and the perovskite light-emitting layer 400.

The perovskite light-emitting layer 400 may comprise a metal halide perovskite material.

In this connection, the metal halide perovskite material has a composition of $ABX_3$, $A_2BX_4$, $ABX_4$ or $A_{n-1}Pb_nI_{3n+1}$ (n is an integer between 2 and 6), wherein A may be a monovalent organic cation or a monovalent metal cation, B may be a divalent or trivalent metal ion, and X may be a monovalent halide ion.

For example, A may be an amidinium-based organic ion, an organic ammonium cation, or a monovalent alkali metal cation. B may Pb, Mn, Cu, Ga, Ge, In, Al, Sb, Bi, Po, Sn, Eu, Yb, Ni, Co, Fe, Cr, Pd, Cd, Ca, Sr, or a combination thereof. X may be Cl, Br, I, or a combination thereof.

A crystal structure of the metal halide perovskite material has a face centered cubic (FCC) structure in which a central metal (M) is positioned at a center and 6 halogen elements (X) are respectively disposed at all faces of a hexahedron, or has a body centered cubic (BCC) structure in which eight organic ammonium ($RNH_3$) are respectively located at all vertices of a hexahedron.

In this connection, the crystal structure of the metal halide perovskite material may have a cubic structure in which all of faces of the hexahedron intersect with each other by 90°, and a width, a length, and height are equal to each other or a tetragonal structure in which all of faces of the hexahedron intersect with each other by 90°, and a width and a length are equal to each other but are different from a height.

Further, the metal halide perovskite material of the perovskite light-emitting layer 400 may have a perovskite crystal structure including a mixture of organic and inorganic materials. The organic and inorganic materials of the metal halide perovskite material may include $CH_3NH_3$, and Pb and X (Cl, Br or I), respectively. The disclosure is not necessarily limited thereto.

For example, the metal halide perovskite material may be $CH_3$ $NH_3PbBr_3$, $CH_3NH_3PbBr_{3-x}I_x$, or $CH_3NH_3$ $PbBr_{3-x}Cl_x$.

The metal halide perovskite material may include $A_2BX_4$, $ABX_4$ or $A_{n-1}Pb_nI$ (n is an integer between 2 and 6) having a two-dimensional structure in a lamellar shape. In this connection, A is an organic ammonium material, B is a metal material, and X is a halogen element.

For example, A may be $(CH_3NH_3)_n$, $(C_xH_{2x-1}NH_3)_2$ $(CH_3NH_3)_n$, $(RNH_3)_2$, $(C_nH_{2n+1}NH_3)_2$, $(CF_3NH_3)$, $(CF_3NH_3)_n$, $(C_xF_{2x+1}NH_3)_2(CF_3NH_3)_n$, or $(C_nF_{2n+1}NH_3)_2$ (each of n and x is an integer greater than 1). B may be a divalent or trivalent transition metal, rare earth metal, alkaline earth metal, Pb, Sn, Ge, Ga, In, Al, Sb, Bi, Po, or a combination thereof. In this connection, the rare earth metal may be Ge, Sn, Pb, Eu or Yb. The alkaline earth metal may be Ca or Sr. X may be Cl, Br, I, or a combination thereof.

In the perovskite light-emitting device according to an aspect of the present disclosure, a thickness of the perovskite light-emitting layer 400 may be 500 nm or smaller, alternatively smaller than 150 nm.

In general, when growing perovskite on the hole transport layer containing PEDOT:PSS as a hole transport material, a perovskite light-emitting layer having low crystallinity may be formed or defects may occur in the perovskite light-emitting layer due to various causes as described above. Accordingly, for example, even when the perovskite light-emitting layer is formed to have a thickness of 150 nm or greater, a perovskite crystal is formed, but due to many defects at the interface, a large leakage current and non-radioactive recombination are induced, resulting in decrease the efficiency of the light-emitting device.

In one example, according to the present disclosure, the hole transport layer 300 contains the compound represented by the Chemical Formula 1. The compound represented by the Chemical Formula 1 may improve the crystallinity of the perovskite light-emitting layer 400 grown on the hole transport layer 300 and may reduce interfacial defects, due to neutral pH characteristics and counter ions, compared to PEDOT:PSS.

In other words, the compound represented by the Chemical Formula 1 passivates defects in the crystal of the perovskite light-emitting layer 400 located at the interface of the hole transport layer 300 so that a more stabilized phase of the perovskite may grow.

Therefore, the perovskite light-emitting device according to an aspect of the present disclosure may exhibit sufficient light-emitting characteristics even when the perovskite light-emitting layer 400 has a smaller thickness (for example, 10 nm) is applied, compared to a case of using PEDOT:PSS.

The electron transport layer 500 on the perovskite light-emitting layer 400 may include a known electron transport material such as $Alq_3$ (Tris(8-hydroxyquinolinato)aluminium), TAZ (3-(Biphenyl-4-yl)-5-(4-tert-butylphenyl)-4-phenyl-4H-1,2,4-triazole), BAlq (Bis(8-hydroxy-2-methylquinoline)-(4-phenylphenoxy)aluminum), $BeBq_2$ (bis(10-hydroxybenzo[h]quinolinato)-beryllium), BCP (Bathocuproine), Bphen (Bathophenanthroline), TBPI (2,2',2"-(1,3,5-Benzinetriyl)-tris(1-phenyl-1-H-benzimidazole)), TmPyPB (1,3,5-Tri(m-pyridin-3-ylphenyl)benzene), 3TPYMB (Tris(2,4,6-triMethyl-3-(pyridin-3-yl)phenyl)borane) or TpPyPB (1,3,5-tri(p-pyrid-3-yl-phenyl)benzene. Further, although not separately shown, an electron injection layer may be disposed on the electron transport layer 500.

The second electrode 600 disposed on the electron injection layer may be made of a metal having a relatively low work function, an alloy thereof, an electro-conductive compound, and a combination thereof. Specific examples thereof include lithium (Li), magnesium (Mg), aluminum (Al), aluminum-lithium (Al—Li), calcium (Ca), magnesium-indium (Mg—In), and magnesium-silver (Mg—Ag).

Hereinafter, specific examples of the present disclosure are presented. However, the examples as described below are only intended for specifically exemplifying or describing the present disclosure and should not limit the present disclosure thereto.

Example 1

After coating ITO as a first electrode on a glass substrate, a solution (3 mg/ml in co-solvent (methanol+DI water)) containing a following compound [FPS-K] was spin-coated (5000 rpm, 45 seconds) on the first electrode and then heat treatment was carried out at 100° C. for 10 minutes to form a 5 nm-thick hole transport layer.

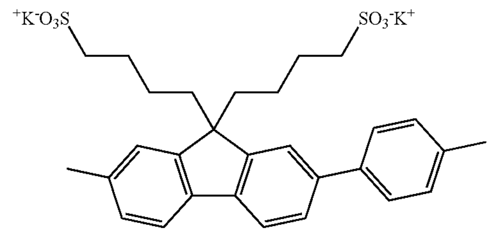

[FPS-K]

Lead bromide ($PbBr_2$), formamidine hydrobromide (FABr), and phenylmethylamine hydrobromide (PMABr) at $PbBr_2$:FABr:PMABr=1:0.67:0.67 was dissolved at concentration of 0.3M (based on Pb) in a solvent at a ratio of DFM:DMSO=7:3, thus to prepare a $PMA_2FA_2Pb_3Br_{10}$ solution.

After spin-coating the $PMA_2FA_2Pb_3Br_{10}$ solution on the hole transport layer (3000 rpm, 30 seconds), chlorobenzene as an anti-solvent was dropped thereon to form a 150 nm-thick perovskite light-emitting layer.

Subsequently, a 50 nm-thick TPBi electron transport layer, a 1 nm-thick LiF electron injection layer, and a 100 nm-thick second electrode (Al) were sequentially thermally deposited on the perovskite light-emitting layer, thereby to manufacture a perovskite light-emitting device.

Example 2

A perovskite light-emitting device was manufactured in the same manner as in Example 1, except that the compound [FPS-TMA] was used instead of the compound [FPS-K].

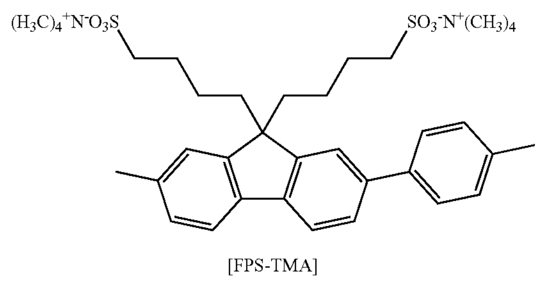

[FPS-TMA]

Example 3

A perovskite light-emitting device was manufactured in the same manner as in Example 1, except that the compound [MPS-TMA] was used instead of the compound [FPS-K].

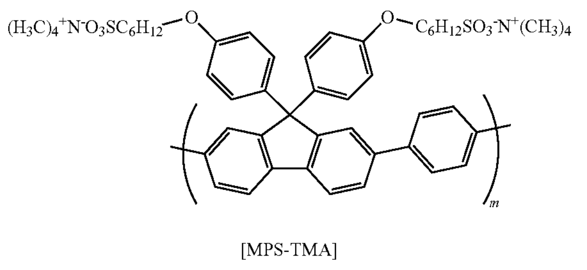

[MPS-TMA]

Comparative Example 1

A perovskite light-emitting device was manufactured in the same manner as in Example 1, except that PEDOT:PSS was used instead of the compound [FPS-K].

Experimental Example 1. Measurement of HOMO Level of Hole Transport Layer

The HOMO level of the hole transport layer of the perovskite light-emitting device as manufactured according to each of Example 1 to Example 3 and Comparative Example 1 was measured using ultraviolet electron spectroscopy (UPS). The measurement results are shown in FIG. 3 to FIG. 6.

Referring to FIG. 3 to FIG. 6, the HOMO level of PEDOT:PSS was 5.01 eV, the HOMO level of FPS-K was 5.98 eV, the HOMO level of FPS-TMA was 5.80 eV, and the HOMO level of MPS-TMA was 5.70 eV.

Referring to FIG. 2 which shows the energy diagram of the perovskite light-emitting device, it may be identified that the HOMO level of the hole transport layer containing the compound represented by the Chemical Formula 1 is between 5.60 and 6.0 eV, and a difference between the HOMO levels of the hole transport layer containing the compound represented by the Chemical Formula 1 and the perovskite light-emitting layer is 0.26 eV or lower.

On the other hand, it may be identified that the HOMO level of the hole transport layer including PEDOT:PSS is about 5.01 eV, and a difference between the HOMO levels of the perovskite light-emitting layer and the hole transport layer including PEDOT:PSS is about 0.70 eV or greater. Thus, unlike the hole transport layer containing the compound represented by the Chemical Formula 1, a large hole injection barrier occurs in Comparative Example 1.

Experimental Example 2. Measurement of Contact Angle of Water on Surface of Hole Transport Layer When the hole transport layer has high hydrophilicity, this may improve the crystallinity of perovskite growing on the hole transport layer due to its good compatibility with perovskite. However, when coating the perovskite precursor material on the hole transport layer, the possibility of damage to the surface of the hole transport layer due to the perovskite precursor material may also increase.

In order to measure the hydrophilicity of the perovskite light-emitting device manufactured according to each of Example 1 to Example 3 and Comparative Example 1 to the hole transport layer, after forming the hole transport layer, water ($H_2O$) was dropped on the surface thereof to measure the surface contact angle. The measurement results are shown in FIG. 7 to FIG. 10.

Referring to FIG. 7 to FIG. 10, the hole transport layer including each of FPS-K and FPS-TMA as well as PEDOT:PSS exhibits a contact angle of water on a surface of about 15° or lower, exhibiting a hydrophilic surface. However, when MPS-TMA is contained in the hole transport layer, the hydrophobicity thereof is relatively increased compared to other hole transport layers.

As described above, the hole transport layer containing MPS-TMA exhibits the hydrophobic surface. Thus, even when a portion of the hole transport layer is dissolved during spin coating of the perovskite precursor material, aggregation between the hole transport materials may be suppressed, thereby preventing damage to the hole transport layer.

Experimental Example 3. PL Lifetime Measurement of Perovskite Light-Emitting Device Excitation light was irradiated to a perovskite light-emitting device manufactured according to each of Examples 1 to 3 and Comparative Example 1. Then, the PL lifetime thereof based on an irradiation time duration of the excitation light was measured.

Figure 11:
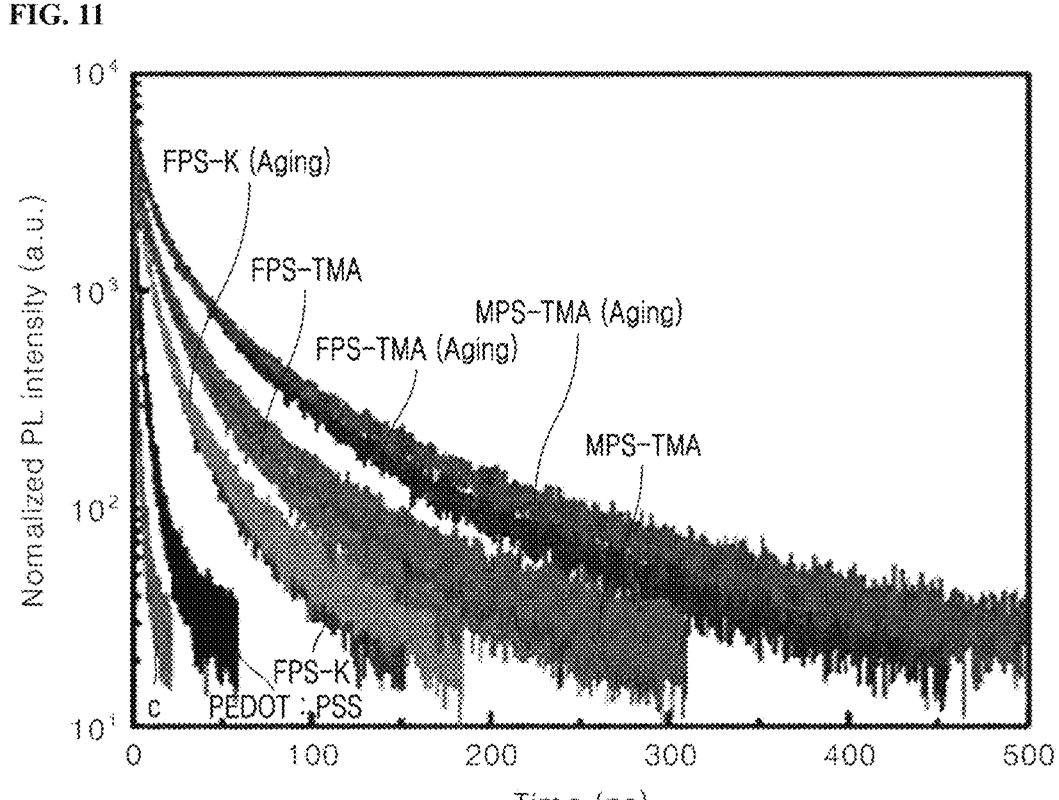
FIG. 11 shows measurement results of PL lifetimes for perovskite light-emitting devices manufactured according to Examples 1 to 3 and Comparative Example 1, respectively.

FIG. 11 and Table 1 show the measurement results of the PL lifetime for perovskite light-emitting devices manufactured according to Examples 1 to 3 and Comparative Example 1, respectively.

TABLE 1

| Examples | $\tau_{avr}$ (ns) | $\chi^2$ |
|---|---|---|
| Example 1 | 5.42 | 1.2516 |
| Example 2 | 9.99 | 1.1731 |
| Example 3 | 10.47 | 1.2315 |
| Comparative Example 1 | 1.70 | 1.1150 |
| Example 1 (aging) | 5.79 | 1.1792 |
| Example 2 (aging) | 17.53 | 1.1801 |
| Example 3 (aging) | 19.96 | 1.1557 |
| Comparative Example 1 (aging) | 0.62 | 1.1564 |

Referring to the PL lifetime measurement result, it may be identified that the PL lifetime of the perovskite light-emitting device manufactured according to each of Examples 1 to 3 is longer than that of Comparative Example 1. This is because in the perovskite light-emitting device manufactured according to Comparative Example 1, PL quenching occurs due to defects in the perovskite light-emitting layer as caused by the PEDOT:PSS in the hole transport layer, and thus the PL lifespan is reduced.

In the perovskite light-emitting device manufactured according to each of Example 2 and Example 3, the counter ions of the hole transport material include ions contained in the perovskite light-emitting layer. Thus, the passivation effect on the perovskite crystal defects located at the interface between the hole transport layer and the perovskite light-emitting layer may be realized. Thus, it may be identified that the PL lifespan of the perovskite light-emitting device manufactured according to each of Example 2 and Example 3 is relatively longer than that of Example 1.

Further, in Example 3, it may be identified that due to the hydrophobic properties of MPS-TMA, the hole transport layer is less damaged, and thus the PL lifespan is relatively longer, compared to those of Example 1 and Example 2.

In one example, after manufacturing a perovskite light-emitting device according to each of Example 1 to Example 3 and Comparative Example 1, and then encapsulating the device, aging treatment was applied to the encapsulated device for 24 hours in a nitrogen atmosphere at room temperature, and then the PL life thereof was measured under the same condition. Thus, it may be seen that the perovskite light-emitting device manufactured according to Comparative Example 1 has a short PL lifetime, whereas the perovskite light-emitting devices manufactured according to Examples 1 to 3 have a longer PL lifetime.

Experimental Example 4. Performance Evaluation of Perovskite Light-Emitting Device The current density, the luminance, the light-emitting efficiency, the power efficiency, and the external quantum efficiency (EQE) of each of the perovskite light-emitting devices as manufactured according to Examples 1 to 3 and Comparative Example 1 were measured.

Figure 12:
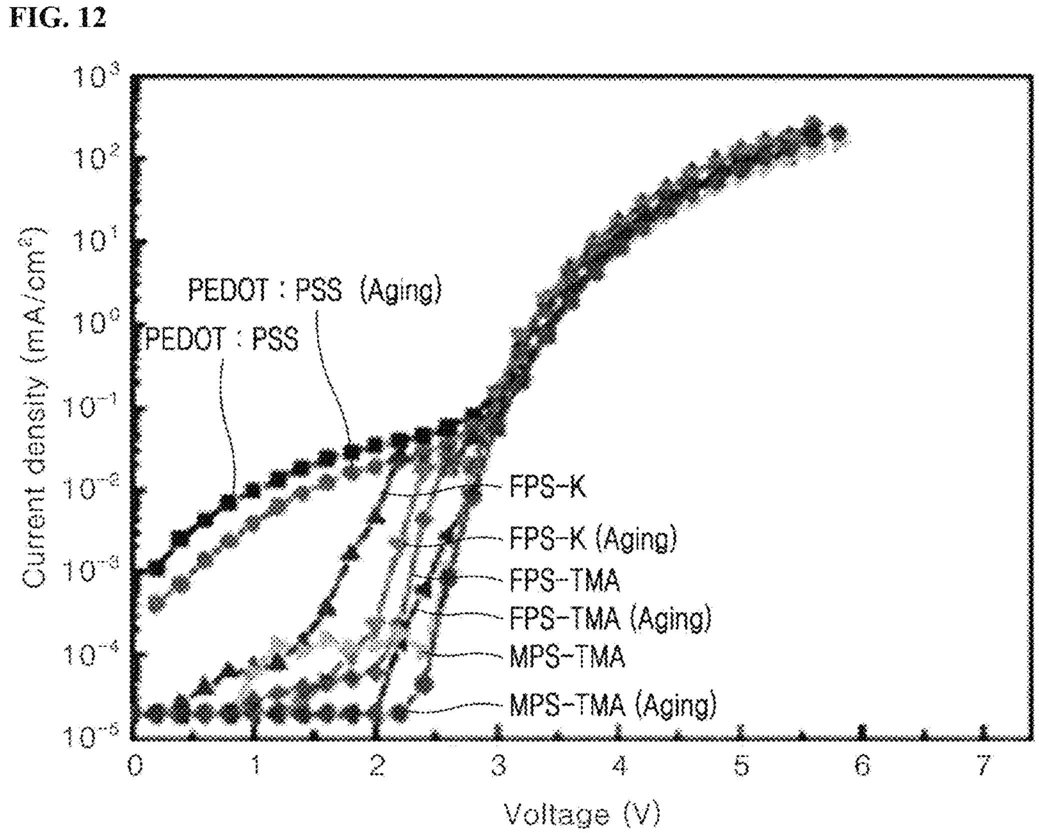
FIG. 12 shows results of measuring current densities of perovskite light-emitting devices manufactured according to Examples 1 to 3 and Comparative Example 1, respectively.

FIG. 12 shows the results of measuring the current density of perovskite light-emitting devices as manufactured according to Examples 1 to 3 and Comparative Example 1.

Referring to FIG. 12, it may be identified that in the Comparative Example 1, a leakage current is present in a low voltage region (0 to 2 V). This measurement result may be identified as being caused by defects in the perovskite light-emitting layer as caused by using the hole transport layer containing PEDOT:PSS.

Figure 13:
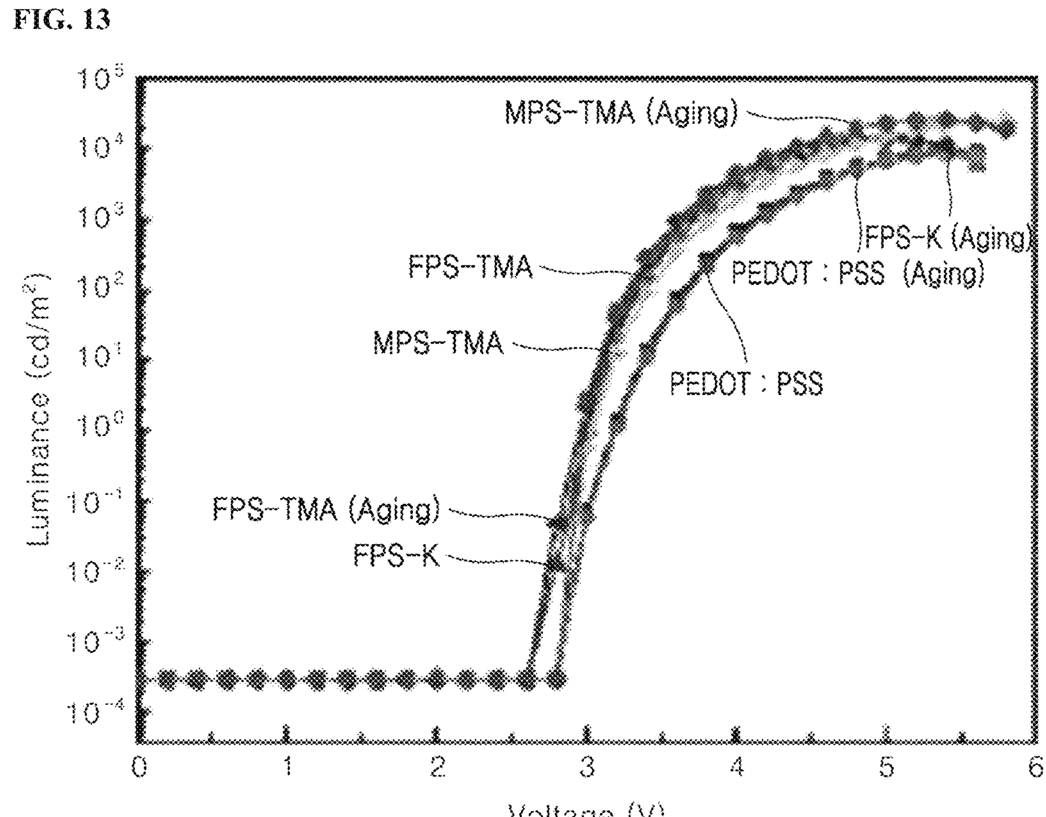
FIG. 13 shows results of measuring luminance of perovskite light-emitting devices manufactured according to Examples 1 to 3 and Comparative Example 1, respectively.
Figure 14:
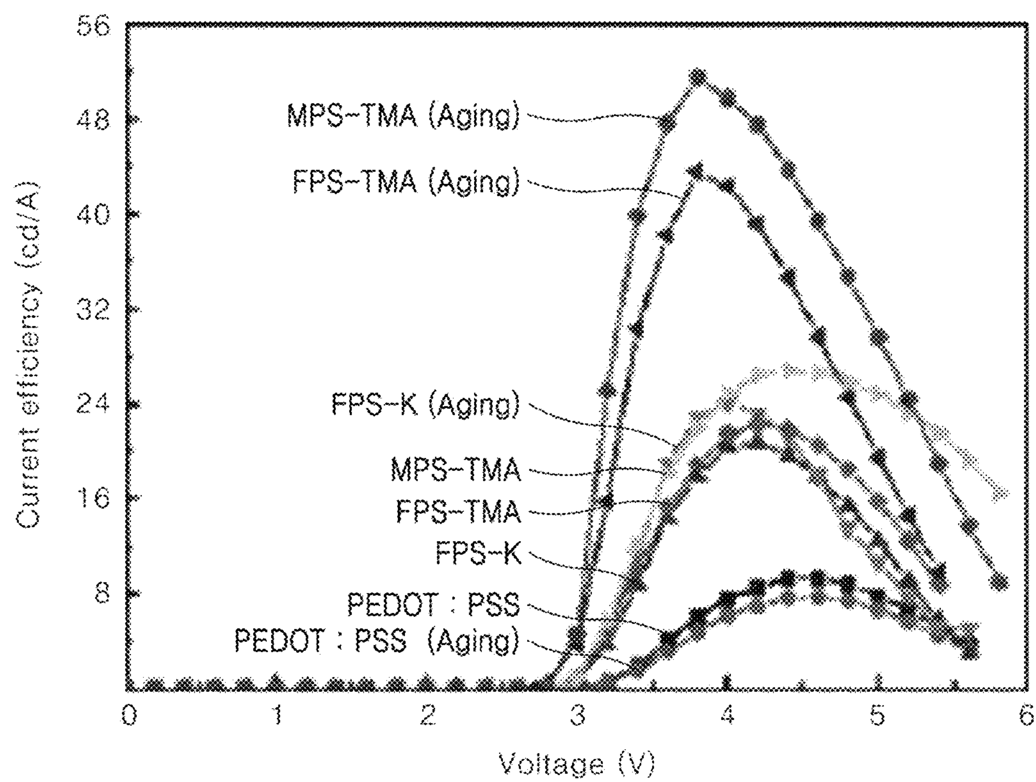
FIG. 14 shows results of measuring light-emitting efficiency of perovskite light-emitting devices manufactured according to Examples 1 to 3 and Comparative Example 1, respectively.
Figure 15:
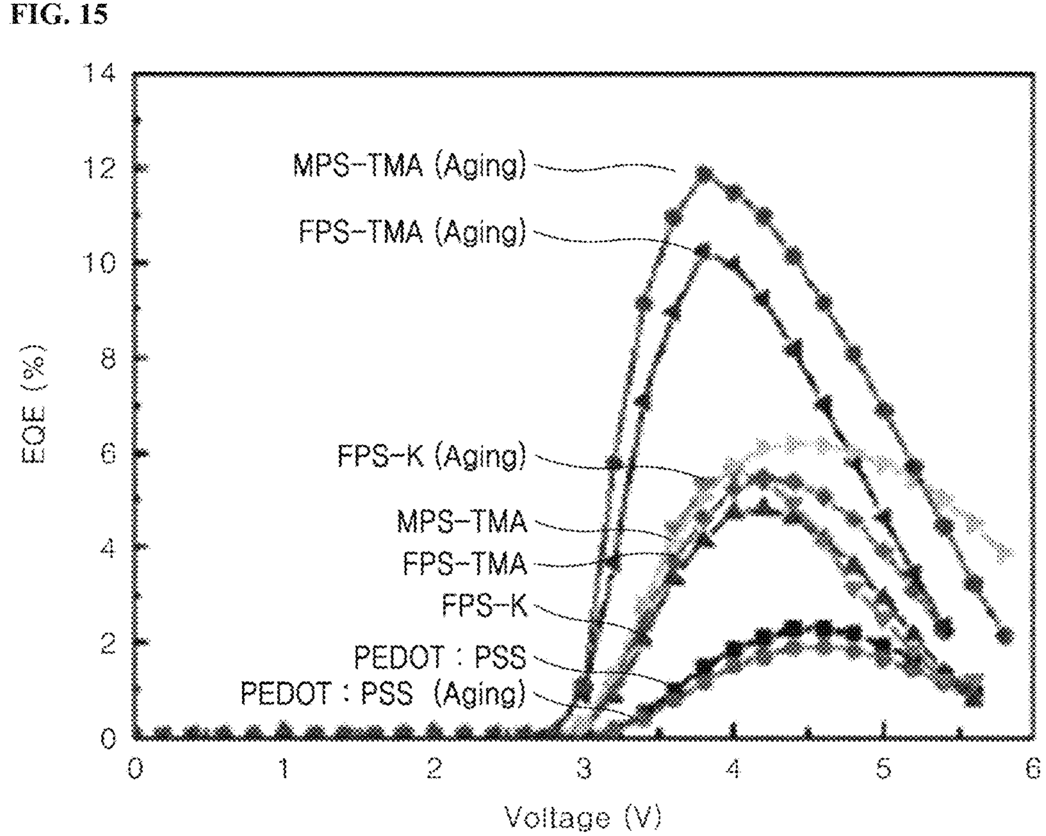
FIG. 15 shows results of measuring external quantum efficiency of perovskite light-emitting devices manufactured according to Examples 1 to 3 and Comparative Example 1, respectively.
Figure 16:
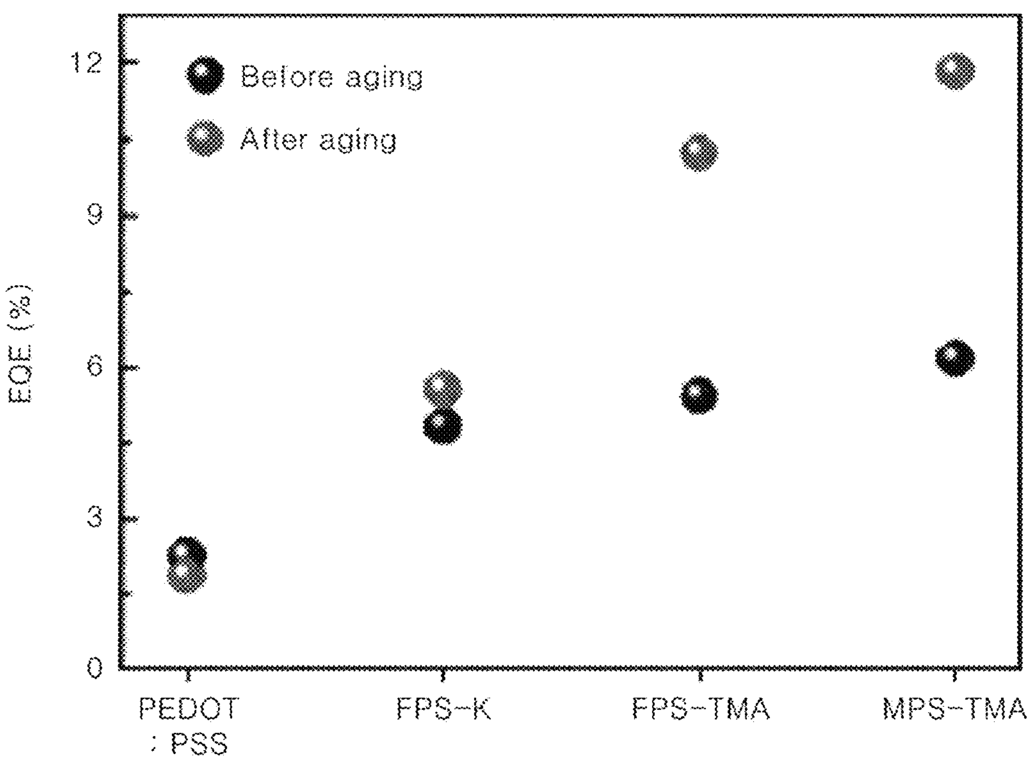
FIG. 16 shows results of measuring changes in external quantum efficiency before and after aging of perovskite light-emitting devices manufactured according to Examples 1 to 3 and Comparative Example 1, respectively.

FIG. 13 shows the results of measuring the luminance of perovskite light-emitting devices manufactured according to Examples 1 to 3 and Comparative Example 1. FIG. 14 shows the results of measuring the light-emitting efficiency of perovskite light-emitting devices manufactured according to Examples 1 to 3 and Comparative Example 1. FIG. 15 shows the results of measuring the external quantum efficiency of perovskite light-emitting devices manufactured according to Examples 1 to 3 and Comparative Example 1. FIG. 16 shows the results of measuring changes in external quantum efficiency before and after aging treatment for 24 hours in a nitrogen atmosphere at room temperature, of perovskite light-emitting devices manufactured according to Examples 1 to 3 and Comparative Example 1. Further, Table 2 describes the measurement results of FIG. 13 to FIG. 16.

TABLE 2

| Examples | $L_{max}$ (cd/m2) @bias | $LE_{max}$ (cd/A) @bias | $PE_{max}$ (Im/W) @bias | $EQE_{max}$ (%) @bias | Turn-onVoltage (V)(0.1 cd/m$^2$) |
|---|---|---|---|---|---|
| Example 1 | 15,400 @5.0 V | 20.7 @4.2 V | 16.0 @4.0 V | 4.8 @4.2 V | 3.0 |
| Example 2 | 13,500 @5.0 V | 22.2 @4.2 V | 16.8 @4.0 V | 5.4 @4.2 V | 3.0 |
| Example 3 | 25,600 @5.0 V | 26.8 @4.4 V | 19.8 @4.2 V | 6.2 @4.4 V | 3.0 |
| Comparative Example 1 | 9,200 @5.8 V | 9.3 @4.6 V | 6.6 @4.4 V | 2.3 @4.6 V | 3.0 |
| Example 1 (aging) | 12,500 @5.0 V | 24.1 @4.0 V | 18.9 @4.0 V | 5.6 @4.0 V | 3.0 |
| Example 2 (aging) | 14,800 @5.0 V | 43.6 @3.8 V | 36.0 @3.8 V | 10.2 @3.8 V | 3.0 |
| Example 3 (aging) | 25,600 @5.0 V | 51.4 @3.8 V | 42.5 @3.8 V | 11.9 @3.8 V | 3.0 |
| Comparative Example 1 (aging) | 8,600 @5.4 V | 7.7 @4.6 V | 5.5 @4.4 V | 1.9 @4.6 V | 3.0 |

Referring to the results in FIG. 13 to FIG. 16 and Table 2, it may be identified that the performance of the perovskite light-emitting device manufactured according to each of Examples 1 to 3 is improved, compared to Comparative Example 1. It may be identified that the perovskite light-emitting device manufactured according to Example 3 among the examples has the highest performance. The difference between performances of the perovskite light-emitting devices may be expected to be due to the same cause for the difference between PL lifetimes of the perovskite light-emitting devices in Experimental Example 3.

Further, the perovskite light-emitting device manufactured according to Comparative Example 1 exhibited decrease in overall light-emitting device performance after aging, whereas the perovskite light-emitting device manufactured according to each of Examples 1 to 3 exhibited increase in overall light-emitting device performance after aging.

Experimental Example 5. Interface Evaluation of a Perovskite Light-Emitting Device Evaluation of the interface between the hole transport layer and the perovskite light-emitting layer of the perovskite light-emitting device manufactured according to each of Example 1, Example 2, and Comparative Example 1, i.e., the perovskite crystallinity on the surface of the perovskite light-emitting layer in contact with the hole transport layer was performed using XPS (X-ray photoelectron spectroscopy) and XRD (X-ray diffraction) analysis.

Figure 17:
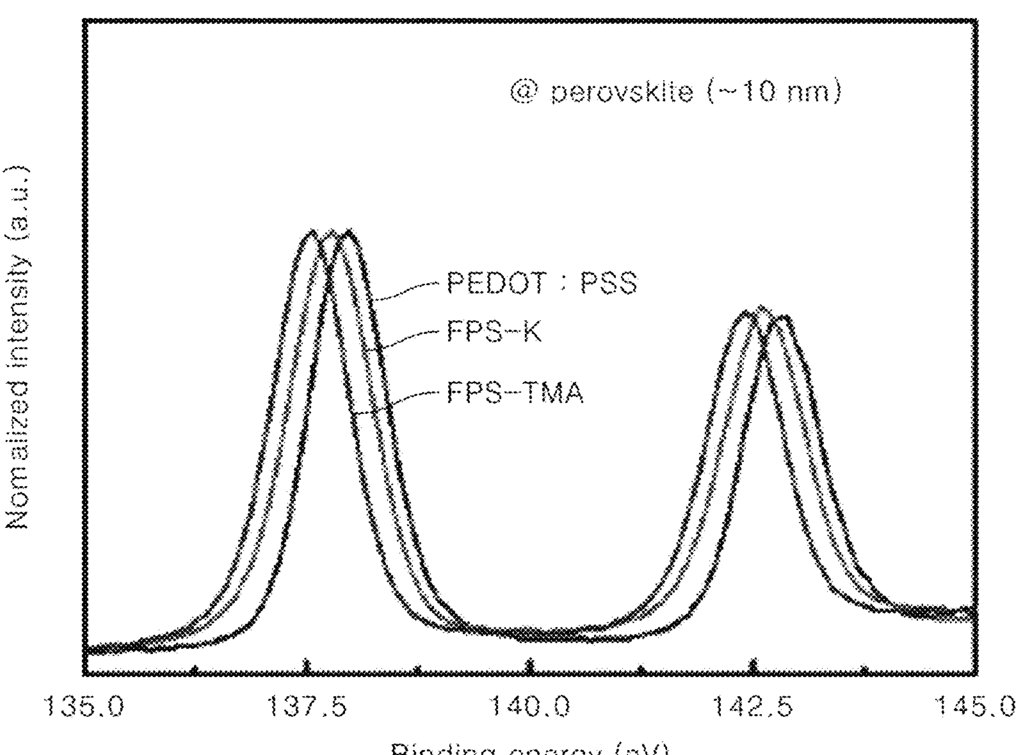
FIG. 17 shows XPS analysis results for perovskite light-emitting layers of perovskite light-emitting devices manufactured according to Example 1, Example 2, and Comparative Example 1, respectively except that a 10 nm thick perovskite light-emitting layer is formed.

FIG. 17 shows the XPS analysis results of perovskite light-emitting devices manufactured according to Example 1, Example 2, and Comparative Example 1, respectively.

Figure 18:
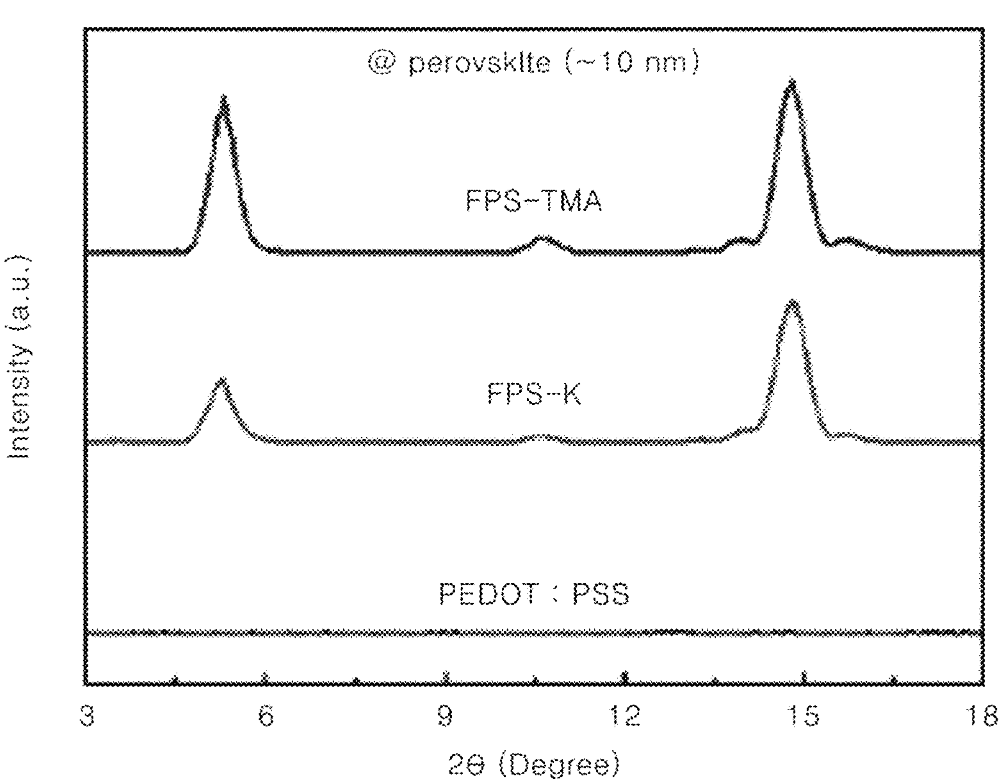
FIG. 18 shows XRD analysis results of perovskite light-emitting layers of perovskite light-emitting devices manufactured according to Example 1, Example 2 and Comparative Example 1, respectively except that a 10 nm thick perovskite light-emitting layer is formed.

FIG. 18 shows the XRD analysis results of perovskite light-emitting devices manufactured according to Example 1, Example 2, and Comparative Example 1, respectively.

Referring to FIG. 17, when growing a 10 nm thick perovskite light-emitting layer, the perovskite light-emitting device according to Comparative Example 1 has the highest binding energy of pb 4f. Example 1 and Example 2 have next lower binding energy in this order. This means that the compound represented by the Chemical Formula 1 may form the perovskite light-emitting layer with less $PbBr_2$ and less halide vacancy defects, compared to PEDOT:PSS.

Referring to FIG. 18, when growing a 10 nm thick perovskite light-emitting layer on the hole transport layer, the XRD peak of perovskite may be identified in the perovskite light-emitting devices manufactured according to each of Example 1 and Example 2. However, the XRD peak of the perovskite cannot be identified in the perovskite light-emitting device manufactured according to Comparative Example 1.

Figure 19:
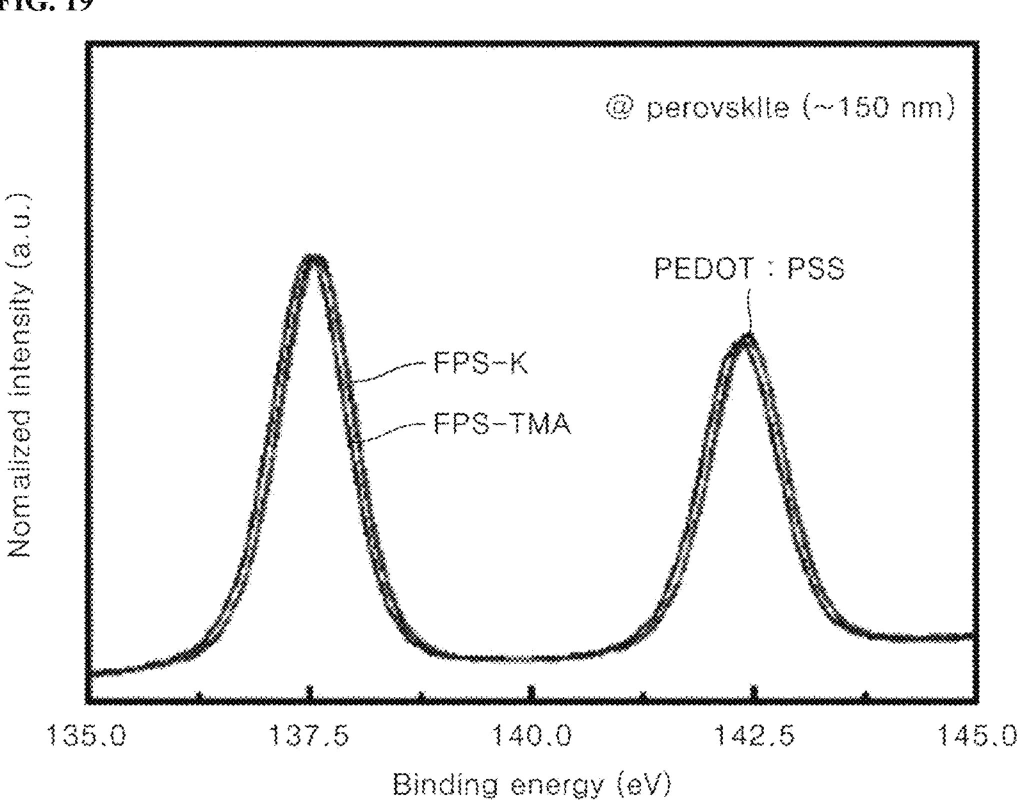
FIG. 19 shows an XPS analysis result for a 150 nm thick perovskite light-emitting layer of a perovskite light-emitting device manufactured in the same manner as Example 1, Example 2, and Comparative Example 1.
Figure 20:
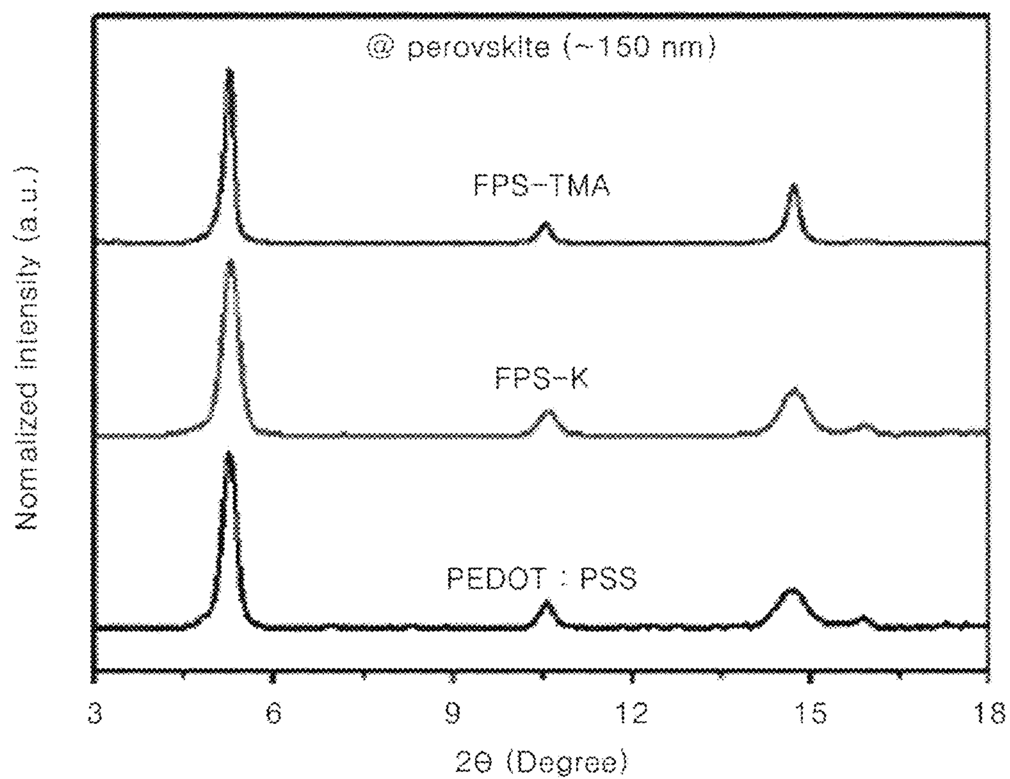
FIG. 20 shows an XRD analysis result of a 150 nm thick perovskite light-emitting layer of a perovskite light-emitting device manufactured in the same manner as Example 1, Example 2, and Comparative Example 1.

In one example, as shown in FIG. 19 and FIG. 20, when the thickness of the perovskite light-emitting layer is 150 nm, the XRD peak of the perovskite crystal may be identified in all of the perovskite light-emitting devices manufactured according to Example 1, Example 2 and Comparative Example 1, unlike a case where the thickness of the perovskite light-emitting layer is 10 nm.

That is, as the thickness of the perovskite light-emitting layer increases, the effect of defects due to the hole transport material contained in the hole transport layer tends to decrease. However, even when the perovskite light-emitting layer is formed to have a thickness of 150 nm or greater, perovskite crystals are formed, but still many defects at the interface induce a large number of leakage currents and non-radioactive recombination, thereby reducing the efficiency of the perovskite light-emitting device.

Experimental Example 6. Evaluation of Performance Change of Perovskite Light-Emitting Device Based on Application of Electrical Stress To evaluate the performance change of the perovskite light-emitting device according to the application of electrical stress, change in the external quantum efficiency (EQE) was measured while increasing the current density applied to the perovskite light-emitting device manufactured according to each of Example 1, Example 2 and Comparative Example 1.

FIG. 21 shows the result of measuring the change in external quantum efficiency based on the electrical stress (current density 0.5 $mA/cm^2$, electrical stress application time: 30 seconds) applied to the perovskite light-emitting device manufactured according to each of Example 1, Example 2, and Comparative Example 1 in the driving direction of the light-emitting device.

FIG. 22 shows the result of measuring the change in external quantum efficiency before/after application of the electrical stress (current density 0.5 $mA/cm^2$, electrical stress application time: 30 seconds) to be applied to the perovskite light-emitting device manufactured according to each of Example 1, Example 2, and Comparative Example 1 in the driving direction of the light-emitting device.

Referring to FIG. 21 and FIG. 22, it may be identified that in the perovskite light-emitting device manufactured according to Comparative Example 1, the external quantum efficiency has decreased after application of the electrical stress, whereas in the perovskite light-emitting device manufactured according to each of Example 1 and Example 2, the external quantum efficiency of the light-emitting device has increased after applying the electrical stress.

The above description has been made based on the aspects shown in the accompanying drawings, but various changes or modifications may be made thereto at the level of a person skilled in the art. Therefore, as long as these changes and modifications do not depart from the scope of the present disclosure, they may be understood as being included within the scope of the present disclosure.

What is claimed is:

1. A perovskite light-emitting device comprising:

a first electrode;

a hole transport layer disposed on the first electrode;

a perovskite light-emitting layer disposed on the hole transport layer;

an electron transport layer disposed on the perovskite light-emitting layer; and a second electrode disposed on the electron transport layer;

wherein the hole transport layer contains a compound represented by a following Chemical Formula 1, wherein a HOMO level of the hole transport layer is in a range of 5.60 to 6.0 eV, wherein a difference between a LUMO level of the hole transport layer and a LUMO level of the perovskite light-emitting layer is 0.3 eV or greater, and wherein a difference between a HOMO level of the hole transport layer and a HOMO level of the perovskite light-emitting layer is 0.26 eV or lower:

[Chemical Formula 1]

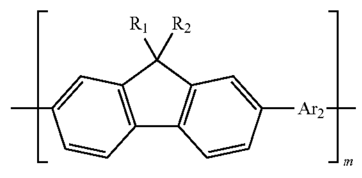

wherein m is an integer between 1 and 1,000,000:

wherein each of $R_1$ and $R_2$ is independently $-Ar_3-(O-C_nH_{2n}-X^-Y^+)_p$; n being is an integer between 1 and 20, and p is an integer between 1 and 3, wherein $Ar_3$ is phenylene, wherein $X^-$ is $SO_3^-$, and $Y^+$ is $NR_3R_4R_5R_6^+$, wherein each of $R_3$ to $R_6$ is independently selected from an alkyl group having 1 to 20 carbon atoms, wherein $Ar_2$ is a substituted or unsubstituted arylene.

2. The device of claim 1, wherein a contact angle of water on a surface of the hole transport layer is 10° or greater.

3. The device of claim 1, wherein a thickness of the perovskite light-emitting layer is 500 nm or smaller.

4. The device of claim 1, wherein the hole transport layer is subjected to post-treatment using electrical stress applied in a driving direction of the perovskite light-emitting device.

5. The device of claim 1, wherein the perovskite light-emitting device is encapsulated and then aged for at least 12 hours in a nitrogen atmosphere at room temperature.

6. The device of claim 1, wherein the compound represented by Chemical Formula 1 is the compound represented by a following compound MPS-TMA

[MPS-TMA]
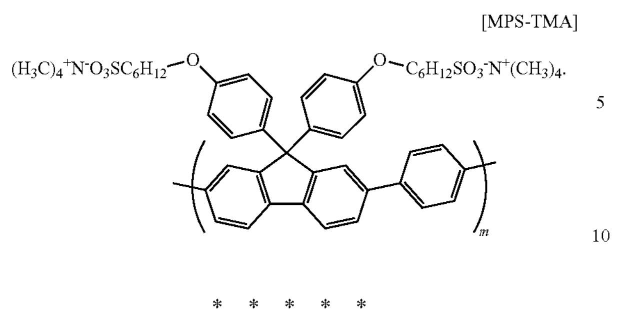
* * * * *